(12) United States Patent
Le Guelvouit et al.

(10) Patent No.: US 9,082,173 B2
(45) Date of Patent: Jul. 14, 2015

(54) PROCESSING DATA FOR ENCODING AND DECODING A MESSAGE

(75) Inventors: Gaëtan Le Guelvouit, Thorigné-Fouillard (FR); Sophie Boutiton, Thorigné-Fouillard (FR)

(73) Assignee: Orange, Paris (FR)

( * ) Notice: Subject to any disclaimer, the term of this patent is extended or adjusted under 35 U.S.C. 154(b) by 188 days.

(21) Appl. No.: 13/805,441

(22) PCT Filed: Jun. 17, 2011

(86) PCT No.: PCT/FR2011/051398
§ 371 (c)(1),
(2), (4) Date: Dec. 19, 2012

(87) PCT Pub. No.: WO2012/001263
PCT Pub. Date: Jan. 5, 2012

(65) Prior Publication Data
US 2013/0094691 A1    Apr. 18, 2013

(30) Foreign Application Priority Data
Jun. 30, 2010   (FR) ...................................... 10 02740

(51) Int. Cl.
*G06T 1/00*     (2006.01)
*H03M 13/01*    (2006.01)
*H03M 13/25*    (2006.01)

(52) U.S. Cl.
CPC ............... *G06T 1/0021* (2013.01); *G06T 1/005* (2013.01); *H03M 13/01* (2013.01); *H03M 13/25* (2013.01); *G06T 2201/0051* (2013.01)

(58) Field of Classification Search
CPC ...................................................... G06T 1/0021
USPC ........................................................ 382/100
See application file for complete search history.

(56) References Cited

U.S. PATENT DOCUMENTS

| | | | |
|---|---|---|---|
| 2004/0228502 A1 | 11/2004 | Bradley et al. | |
| 2005/0010846 A1* | 1/2005 | Kikuchi et al. | ............... 714/752 |
| 2009/0232242 A1 | 9/2009 | Xiong et al. | |

FOREIGN PATENT DOCUMENTS

| | | | | |
|---|---|---|---|---|
| GB | 2 365 295 A1 | 2/2002 | | |
| GB | 2365295 A * | 2/2002 | ............... H04H 1/00 |

OTHER PUBLICATIONS

Practical watermarking scheme based on wide spread spectrum and game theory. Stéphane Pateux, and Gaëtan Le Guelvouit. Apr. 2003.*
Abrardo et al., "Informed Watermarking by Means of Orthogonal and Quasi-Orthogonal Dirty Paper Coding," IEEE Transactions on Signal Processing, IEEE Service Center, New York, NY, US, vol. 53(2), pp. 824-833 (Feb. 1, 2005).

(Continued)

*Primary Examiner* — Stephen R Koziol
*Assistant Examiner* — Delomia Gilliard
(74) *Attorney, Agent, or Firm* — Drinker Biddle & Reath LLP (57) ABSTRACT

Processing data for encoding and decoding a message transmitted through a communication channel having adjacent information known during the encoding, the encoding method comprising the construction of a surjective correcting code produced from a characterization of the adjacent information in a system of spherical coordinates.

12 Claims, 4 Drawing Sheets

(56) References Cited

OTHER PUBLICATIONS

Chen et al., "Quantization Index Modulation: A Class of Provably Good Methods for Digital Watermarking and Information Embedding," IEEE Trans. on Information Theory, p. 46 (1999).

Chou et al., "Turbo Coded Trellis-Based Constructions for Data Embedding: Channel Coding with Side Information," Proc. Conf. on Signals, Systems and Computers, Asilomar, CA, US, pp. 305-309 (Nov. 2001).

Cohen et al., "Generalized Writing on Dirty Paper," Proc. Int. Symp. Information Theory, pp. 1-6 (2002).

Costa, "Writing on Dirty Paper," IEEE Trans. on Information Theory, vol. 29(3), pp. 439-441 (May 1983).

Eggers et al., "Scalar Costa Scheme for Information Embedding," IEEE Transactions on Signal Processing, vol. 51(4), pp. 1003-1019 (Apr. 2003).

Kalantari et al., "Vector Quantization Index Modulation Watermarking Using Concentric Hyperspherical Codebooks," IEEE International Conference on Acoustics, Speech and Signal Processing, 2008, ICASSP 2008, IEEE, Piscataway, NJ, USA, pp. 1741-1744 (Mar. 31, 2008).

Le Guelvouit, "Tatouage robuste d'images par turbo TCQ," Le Gouelvouit's personal webpage Traitement du Signal, vol. 25 (6), pp. 1-16, retrieved from internet website: http://www.gleguelv.org.pu.pdf/ts08.pdf (Apr. 1, 2009).

Liu et al., "A Robust and Invisible Watermarking of 3D Triangle Meshes," Knowledge-Based Intelligent Information and Engineering Systems Lecture Notes in Computer Science, vol. 3684/2005, pp. 881-888 (Jan. 25, 2005).

Miller et al., "Dirty-Paper Trellis Codes for Watermarking," International Conference on Image Processing (ICIP), vol. 2, pp. 129-132 (Sep. 22, 2002).

Ourique et al., "Angle QIM: A Novel Watermark Embedding Scheme Robust Against Amplitude Scaling Distortions," 2005 IEEE International Conference on Acoustics, Speech, and Signal Processing, IEEE, Piscataway, NJ, USA, vol. 2, pp. 797-800 (Mar. 18, 2005).

Pateux et al., "Practical watermarking scheme based on wide spread spectrum and game theory," Signal Processing: Image Communication, Elsevier Science Publishers, Amsterdam, NL, vol. 18(4), pp. 283-296 (Apr. 1, 2003).

\* cited by examiner

PROCESSING DATA FOR ENCODING AND DECODING A MESSAGE

CROSS-REFERENCE TO RELATED APPLICATIONS

This application is the U.S. national phase of the International Patent Application No. PCT/FR2011/051398 filed Jun. 17, 2011, which claims the benefit of French Application No. 1002740 filed Jun. 30, 2010, the entire content of which is incorporated herein by reference.

FIELD

The present invention relates to processing data for encoding and decoding a message transmitted through a communication channel.

In particular, the invention relates to encoding and decoding a message transmitted through a communication channel having adjacent information that is known during encoding.

BACKGROUND

By "transmission of a message and adjacent information through a communication channel" is meant any type or mode of communication of the adjacent information and of the message.

By "adjacent information" is meant a noise disturbing the communication channel, the noise being known during encoding. By "noise" is meant any information that may disturb the transmission of the message. For example, in the case of transmission of a watermarked image, the image constitutes a noise disturbing transmission of the watermarking.

By "surjective correcting code" is meant a correcting code in which each message is associated with q code words, q being an integer greater than or equal to 2.

Consider a Gaussian communication channel 1 (FIG. 1) over which a signal w of maximum power P is transmitted.

Figure 1:
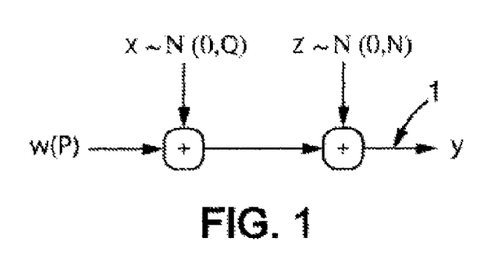
FIG. 1 is a simplified diagrammatic view of a communication channel disturbed by two sources of noise.

The communication channel is disturbed by a noise x modelled by a random variable following a Normal $X \sim N(0,Q)$ law, and by a noise z modelled by a random variable following a Normal $Z \sim N(0,N)$ law.

The capacity of channel 1, i.e. its maximum theoretical transmission efficiency, is equal to:

$$C = \frac{1}{2}\log\left[1 + \frac{P}{Q+N}\right]$$

The higher the emission power P, the larger the capacity C. Conversely, the sum Q+N reduces the capacity C.

The publication by M. H. M. Costa "Writing on dirty paper" (IEEE Trans. on Information Theory, 29(3): 439-441, May 1983) discloses that when the noise x is known at the time of encoding, i.e. during generation of the signal w, the capacity C no longer depends on the power Q. The capacity C therefore becomes equal to the capacity of a Gaussian channel disturbed by a single source of noise Z. Knowledge of the noise x therefore makes it possible to increase the capacity C. The known noise x is called adjacent information.

The publication by A. S. Cohen and A. Lapidoth "Generalized Writing on Dirty Paper" (2002) shows that this result can be extended to channels other than Gaussian.

Let M be a set of messages that can be transmitted. Let $m_j$ be the j-th message of the set M, j being an integer between 1 and the number of messages in the set M.

To approach the limit of capacity C, digital communication systems use correcting codes for encoding the message $m_j$ and for generating, from the encoded message $m_j$, a signal w that is resistant to the disturbances of the sources of noise.

For conventional communication channels, i.e. for which the noise x is not known during encoding, for example a turbo code or a low-density code (Low Density Parity Check, LDPC), is used as the correcting code, both of which give good performance.

For a channel with adjacent information, i.e. when the noise x is known during encoding, the correcting code must be structured in a particular way.

Figure 2:
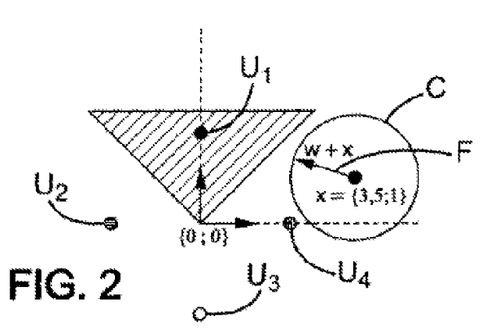
FIG. 2 is a graph representing a conventional correcting code.

In fact, the conventional correcting codes are based on a dictionary that associates a code word $u_j$ with each message $m_j$ (bijective dictionary). FIG. 2 shows an example of a conventional correcting code, for a set of messages M having four elements. The correcting code comprises four code words $u_1$, $u_2$, $u_3$ and $u_4$ associated respectively with four messages $m_1$, $m_2$, $m_3$ and $m_4$.

Assume that the message to be encoded is $m_1$. The associated code word is $u_1$. However, in the presence of adjacent information x of power Q that is too high, the maximum emission power P does not allow the robustness zone (hatched zone) of the code word $u_1$ to be reached. In fact, as can be seen in FIG. 2, with w representing the signal to be transmitted, the point representing the signal received w+x, located at the end of the arrow F on the circle C, is outside of the hatched zone that corresponds to the robustness zone of the code word $u_1$. There will therefore be a decoding error.

To solve this problem, surjective correcting codes called "Costa codes" are used. In these correcting codes, each message $m_j$ is associated with q code words, q being an integer greater than or equal to 2.

A message $m_j$ is then encoded by selecting the code word $u_{j,i}$ closest to the adjacent information x from the q possible code words for encoding $m_j$, i being an integer between 1 and q.

Figure 3:
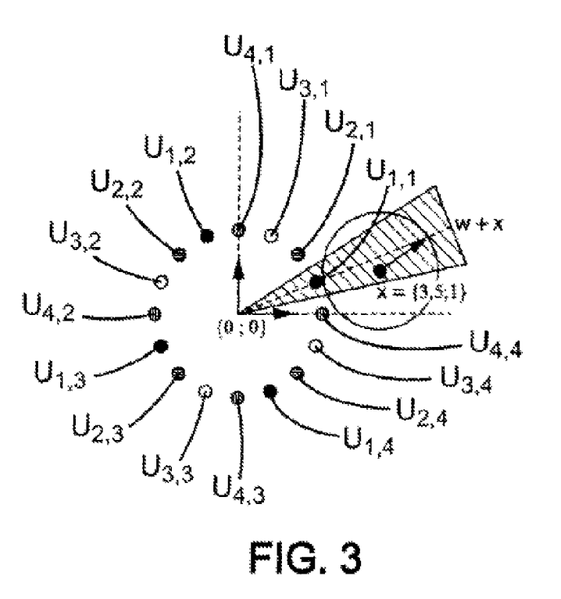
FIG. 3 is a graph representing an ideal Costa code.

By way of example, FIG. 3 shows an ideal Costa code, with q=4 and the set M having four messages $m_1$ to $m_4$. The message $m_1$ is associated with the code words $u_{1,1}$, $u_{1,2}$, $u_{1,3}$ and $u_{1,4}$. Similarly, each message $m_j$ is associated with the code words $u_{j,1}$, $u_{j,2}$, $u_{j,3}$ and $u_{j,4}$. Regardless of the message $m_j$ to be encoded and regardless of the position of the adjacent information x, nearby there is a code word $u_{j,i}$ associated with the message $m_j$.

There are currently two types of construction for surjective codes. The first type of construction is derived from the digital communications community. It uses quantization techniques for creating surjective codes, and associates a conventional correcting code with them. Such codes are described for example in the publication by G. Le Guelvouit "Tatouage robuste d'images par turbo TCQ" [Robust watermarking of images by turbo TCQ] (Traitement du Signal, Vol. 25, No. 6, April 2009), in the publication by B. Chen and G. W. Wornell "Quantization Index Modulation: A Class of Provably Good Methods for Digital Watermarking and Information Embedding" (IEEE Trans. on Information Theory, 1999) and in the publication by J. Chou, S. S. Pradhan, and K. Ramchandran "Turbo coded trellis-based constructions for data embedding: channel coding with side information" (In Proc. Conf. on Signals, Systems and Computers, Asilomar, Calif., November 2001).

The quantization permits simple association of several code words $u_{j,i}$ with each message $m_j$. It is based on determination of a quantization interval, which corresponds to the distance between two code words $u_{j,i}$ associated with one and the same message $m_j$.

For example, in the scalar case, if the quantization interval is defined as equal to 10, the values 0, 10, 20, 30, etc. are associated with the '0' bit and the values 5, 15, 25, 35, etc. to the '1' bit. For encoding the '1' bit with an adjacent information of 22, the code word 25 is then used.

This approach allows results to be obtained close to the theoretical limits of capacity C. The drawback is that it offers no robustness for the scale factors. For example, if the communication channel undergoes an unexpected attenuation by a factor 8/10, the code word 25 will be transformed to 20, i.e. to a code word associated with the '0' bit.

Figure 4:
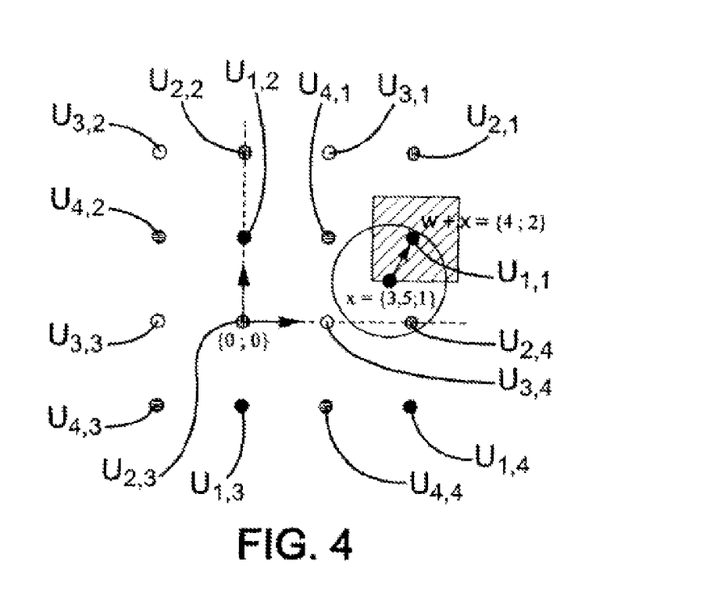
FIG. 4 is a graph representing a quantization code.

FIG. 4 illustrates the principle of quantization in 2 dimensions. The set M comprises four messages. The code is constructed by quantization of the 2D space. Each message $m_j$ is associated with the code words $u_{j,1}$ to $u_{j,q}$. The code words repeat indefinitely. In FIG. 4, for reasons of clarity, only four code words $u_{j,i}$ are shown for each message $m_j$. Quantization ensures a regular distribution of the code words $u_{j,i}$ in space and therefore good performance.

To transmit a message $m_j$, the communication system selects, from the code words $u_{j,i}$ associated with the message $m_j$, the code word $u_{j,i}$ closest to the adjacent information x, in the Euclidean sense. In FIG. 4, it is the vector $u_{1,1}$ that is closest. Then the communication system generates the signal w from the code word $u_{j,i}$ selected, using a technique for compensating, by anticipation, the addition of noise x during transmission through the channel.

Figure 5:
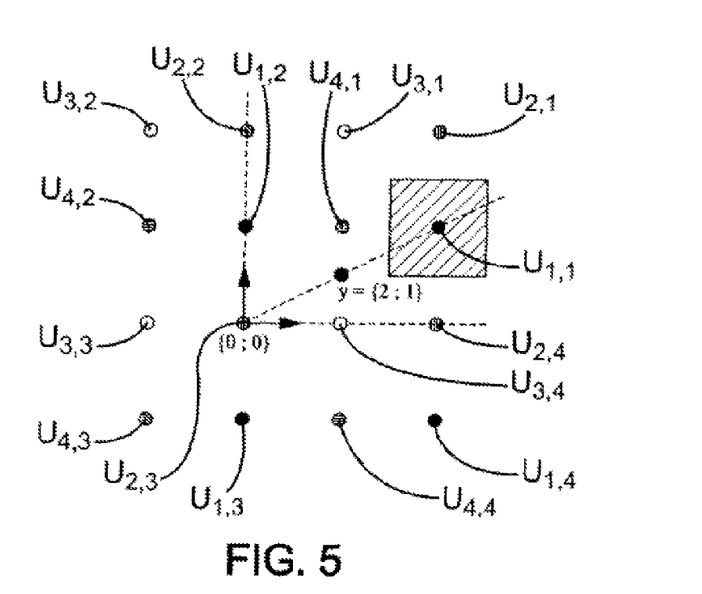
FIG. 5 is a graph representing the code in FIG. 4, the channel having undergone attenuation.

FIG. 5 shows the signal received y, corresponding to the signal transmitted w, the communication channel 1 having undergone attenuation. The signal received y leaves the robustness zone (hatched zone) of the code word $u_{j,i}$. There is therefore a decoding error.

The second type of construction is derived from the digital watermarking community. It is described for example in the publication by M. L. Miller, G. J. Doërr and I. J. Cox. "Dirty-paper trellis codes for watermarking", in IEEE Int. Conf. on Image Processing, Rochester, N.Y., September 2002.

This type of construction uses a convolutional code and a Viterbi decoding algorithm. The Viterbi decoding algorithm is modified by adding multiple arcs between states, so that each state at time t is linked to all the states of time t+1. The path, i.e. the succession of arcs, selected is a function of the message $m_j$ to be encoded and of the adjacent information x. The arcs correspond to pseudo-random sequences, and the distance between these sequences and the adjacent information is their correlation.

The advantage of this technique is that it is not sensitive to attenuation, and more generally to scale factors, as all the correlations are influenced in the same way. The path of the trellis will therefore be the same in the case when the communication channel undergoes attenuation. The drawback is that this approach gives results that are a long way from the limit of capacity C, i.e. an error rate as a function of the P/N ratio of the high communication channel 1.

Figure 6:
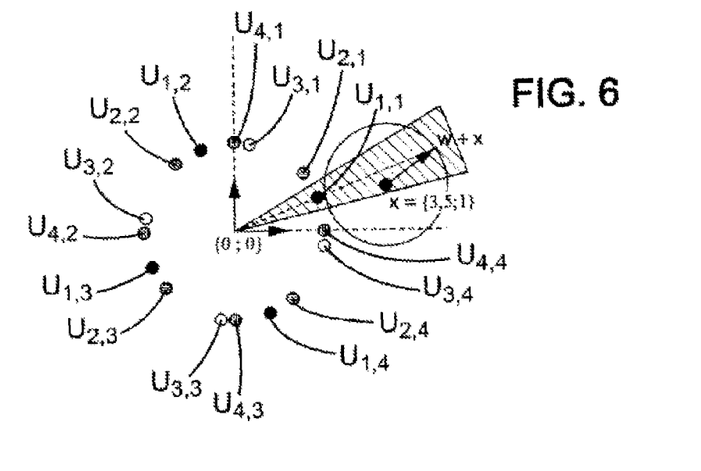
FIG. 6 is a graph representing a code based on the Viterbi correlation and algorithm.

FIG. 6 shows a surjective code based on the Viterbi correlation and algorithm. The set M comprises four messages. The code words $u_{j,i}$ are arranged on a circle and therefore have the same energy. Consequently, the code is not sensitive to the change of scale. However, the code words $u_{j,i}$ are not distributed uniformly, which limits the performance.

Document XP010790760 Ourique et al., "Angle QIM: A novel watermark embedding scheme robust against amplitude scaling distortions,"2005 IEEE International Conference on Acoustics, Speech, and Signal Processing, 18-23 Mar. 2005, Philadelphia, PA, USA) describes a method of watermarking comprising the construction of a surjective correcting code based on characterization of the adjacent information in a spherical coordinate system. However, construction of the correcting code lacks precision.

SUMMARY

The present invention will improve the situation.

For this purpose, the invention proposes an encoding method a message for transmission through a communication channel having adjacent information that is known during encoding, the encoding method comprising construction of a surjective correcting code, in which the surjective correcting code is constructed on the basis of characterization of the adjacent information in a spherical coordinate system, characterized in that it comprises the following steps:

a) determining a spherical information vector characterizing the adjacent information in the spherical coordinate system, the spherical information vector having a size n, n being a positive integer, b) constructing a surjective correcting code using the spherical information vector and carrying out a quantization operation comprising determining a quantization interval as a function of a number of code words to be associated with a message, the quantization interval being equal to $2\pi/q^{1/(n-1)}$, where q is the number of code words to be associated with a message, and determining, from the quantization interval, a set of code words distributed over the surface of a hypersphere with centre 0 and of radius equal to the value of a given component of the spherical information vector and c) encoding the message, using the surjective correcting code.

The term "quantization code" is used for all the surjective correcting codes based on quantization of the adjacent information, for example scalar quantization code, vectorial quantization code, trellis ("lattice") code, TCQ (Trellis Coded Quantization) code, turbo TCQ code, etc. Quantization makes it possible to obtain a good distribution of the code words.

The solution proposed in this invention can combine the performance of codes based on quantization and the strength of codes based on correlation.

A regular grid of code words will be "plated" on the surface of a hypersphere, which makes it possible to obtain a code that is not sensitive to the change of scale.

The invention thus combines the advantages of the known techniques (excellent correction performance and insensitivity to the scale factor), without their drawbacks. The quantization interval is adapted as a function of the number of code words q.

Thus, the code words have the same energy and are not sensitive to the change of scale.

Step c) advantageously comprises an operation of selecting a code word closest to the spherical information vector from the code words associated with the message.

Selecting a code word closest to the adjacent information makes it possible to approach the limit of capacity of the communication channel.

Step c) preferably comprises an operation of determining a Cartesian code word vector, characterizing the code word selected in a Cartesian coordinate system, from a spherical code word vector, characterizing the code word selected in the spherical coordinate system. The signal generated is a function of the Cartesian code word vector.

Construction of the code is carried out in the spherical coordinate system. The code word selected is therefore characterized initially by its spherical coordinates. This code word has its coordinate system changed to allow generation of the signal in the Cartesian coordinate system, for example by adding the code word and the adjacent information in Cartesian coordinates component by component.

Advantageously, in step a), the spherical information vector is determined from a Cartesian information vector, characterizing the adjacent information in a Cartesian coordinate system, the Cartesian information vector being of size n.

The Cartesian information vector, representing the adjacent information in a Cartesian coordinate system, is the vector used for generating the signal. The change of coordinate system permits construction of the code.

Advantageously, step a) comprises an operation of generating a pseudo-random noise, starting from a key. The pseudo-random noise generated is added to components of the spherical information vector. The use of a key makes it possible to ensure confidentiality of transmission.

Owing to the construction of the code, the signal transmitted is advantageously decoded by a specific decoding method. Thus, the invention also relates to a decoding method comprising a step of determining a spherical signal vector, characterizing a signal received in a spherical coordinate system, starting from a Cartesian signal vector, characterizing the signal received in a Cartesian coordinate system.

The calculation steps of the encoding and decoding methods can be performed by a computer program.

Thus, the invention also relates to a computer program comprising instructions for applying the encoding and decoding methods.

The computer program for implementation of the encoding method can be executed in an encoder.

Thus, the invention also relates to an encoder of a message intended to be transmitted through a communication channel having adjacent information that is known during encoding. The encoder comprises means for constructing a surjective correcting code arranged for constructing the surjective code based on characterization of the adjacent information in a spherical coordinate system.

The encoder preferably comprises:
a) means for determining a spherical information vector characterizing the adjacent information in the spherical coordinate system, the spherical information vector having a size n, n being a positive integer,
b) means for constructing a surjective correcting code using the spherical information vector, and
c) suitable encoding means for encoding the message, using the surjective correcting code.

The encoder can be incorporated in transmitting equipment. The invention therefore also relates to transmitting equipment having the encoder.

The computer program for implementation of the decoding method can be executed in a decoder.

The invention therefore also relates to a decoder of a message encoded by the aforementioned encoder. The encoder comprises means for determining a spherical signal vector, characterizing a signal received in a spherical coordinate system, from a Cartesian signal vector, characterizing the signal received in a Cartesian coordinate system.

The decoder can be incorporated in receiving equipment. The invention therefore also relates to receiving equipment having the aforementioned decoder.

BRIEF DESCRIPTION OF THE DRAWINGS

Other features and advantages of the invention will become clearer on reading the description given below. This is purely illustrative and must be read with reference to the attached drawings in which.

DETAILED DESCRIPTION

Consider the communication channel 1 in FIG. 1. This channel has a noise x that is known during encoding and is called adjacent information.

Figure 7:
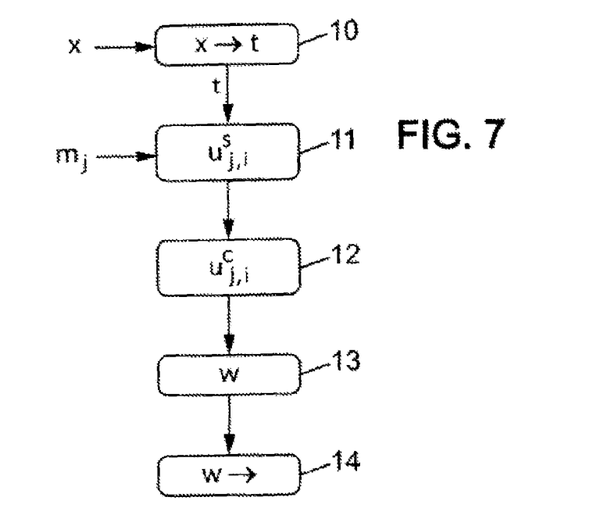
FIG. 7 is a flowchart showing the steps of an encoding method according to one embodiment of the invention, this flowchart can represent the general algorithm of the computer program within the meaning of the invention.
Figure 9:
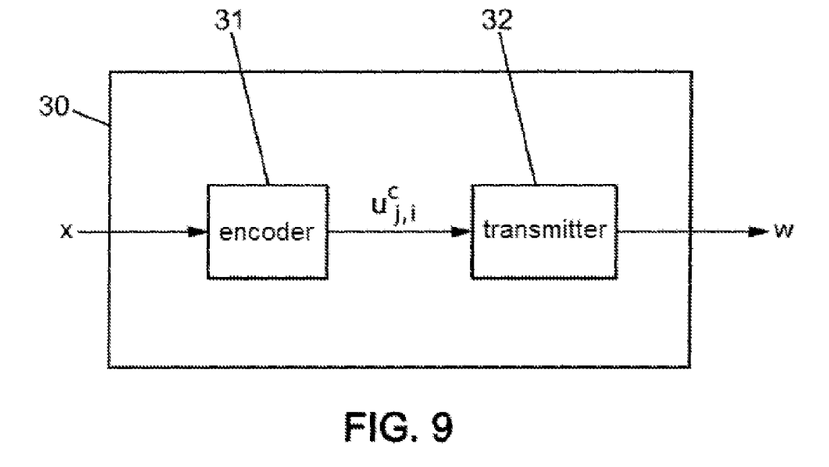
FIG. 9 is a functional diagram showing an encoder, suitable for implementing the encoding method of FIG. 7, the encoder being incorporated in transmitting equipment.

Referring to FIG. 7, a particular embodiment of the method for encoding a message $m_j$ according to the invention is described. The method is for example executed by an encoder 31 incorporated in transmitting equipment 30 (FIG. 9).

At step 10, the adjacent information received is represented in the form of a vector x of Cartesian coordinates (x[1], ..., x[n]) in a Cartesian coordinate system. The vector x is of size n, n being a positive integer. During this step 10, the encoder 31 operates a change of coordinate system, passing from the Cartesian coordinate system to a spherical coordinate system. The vector x of Cartesian coordinates (x[1], ..., x[n]) in the Cartesian coordinate system is thus changed into a vector t of spherical coordinates (t[1], ..., t[n]) in the spherical coordinate system. The change of coordinate system is for example performed by the following algorithm 1:

```
t[n] = 0;
for i = 1 to n
{
        t[n] = t[n] + x[i] * x[i];
}
t[n] = sqrt(t[n]);
t[n - 1] = 0.5 * mod(2*PI + atan2(x[n], x[n - 1]), 2*PI);
s = x[n] * x[n];
for i = n - 2 to 1
{
        s = s + x[i + 1] * x[i + 1];
        t[i] = atan2(sqrt(s), x[i]);
}
```

In this algorithm:
sqrt(a) denotes the square root of a, atan2(y, x) denotes an angle in radians between the positive part of the x axis of a plane, and the point of this plane at the coordinates (x,y), and mod(a, b) denotes the remainder of the Euclidean division of a by b.

The first loop (i=1 to n) is executed for i less than or equal to n, i.e. between i=1 and i=n. At each iteration, the component t[n] takes as its value the sum of the value of t[n] at the preceding iteration and of the square of the i-th component x[i] of the vector x.

On exiting from the first loop, the component t[n] therefore has as its value the sum of the squares of each component x[i] of the vector x.

Then using the function sqrt(t[n]) it is possible to calculate the root of this sum of squares. The component t[n] is thus equal to the modulus of the vector x.

Before the second loop, the component t[n−1] is calculated as being equal to half of atan2(x[n], x[n−1]) modulo 2π. The component t[n−1] is thus an angle in radians. The coefficient 0.5 makes it possible to normalize this angle between 0 and π.

The second loop (i=n−2 to 1) is executed for i greater than or equal to 1, for i decreasing varying from i=n−2 to i=1 inclusive. The second loop makes it possible to calculate the values of the components t[1] to t[n−2] of the vector t.

At each iteration of the second loop, the corresponding component t[i] is calculated as being equal to the angle given by atan2(sqrt(s), x[i]), where s is the sum of the squares of each component of the vector x of rank strictly above i.

The vector t=(t[1], . . . , t[n]) characterizes the adjacent information x in a spherical coordinate system. The components t[1] to t[n−1] of the vector t are angles (normalized between 0 and π) and the component t[n] is a radius.

Step 11 is a step of encoding the message $m_j$. The quantization interval d of the code is calculated from the formula:

$$d = 2\pi/q^{1/(n-1)}$$

where q denotes the number of code words $u_{j,1}$ associated with the message $m_j$.

Thus, the quantization interval d is calculated by dividing the angle 2π by the number of code words associated with the message $m_j$, raised to the power 1/(n−1). The quantization interval d is common to the encoding and the decoding phase. It should be noted that for the calculations, a normalization coefficient of 0.5 can also be used. In this case, the normalized quantization interval d is equal to $\pi/q^{1/(n-1)}$.

The quantization interval d is then used for determining, by quantization, code words $u_{j,i}$. The coding by quantization is for example of the turbo TCQ type. Such coding guarantees good distribution of the code words relative to one another. It would be possible to use instead coding by quantization of the SCS type as described in the article by J. J. Eggers, R. Bauml, R. Tzschoppe, B. Girod. "Scalar Costa Scheme for Information Embedding" (IEEE Transactions on Signal Processing, 2002) or coding by quantization of the QIM type as described in the article by B. Chen, G. Wornell. "Quantization index modulation: A class of provably good methods for digital watermarking and information embedding" (IEEE Trans. Inf. Theory, 2001).

Using this method, all the code words $u_{j,i}$ are arranged on the surface of a hypersphere with centre 0 and with the component t[n] of the vector t as radius. Consequently, all the code words $u_{j,i}$ have the same energy, so that the code is not sensitive to the change of scale. Thus, even if the communication channel 1 undergoes attenuation, the code word obtained after decoding will be the right one.

The (n−1) first components of the vector t are quantized for selecting the code word $u_{j,i}$ closest to the adjacent information, from the code words $u_{j,i}$ associated with the message $m_j$. In the spherical domain, the code word that is closest in the Euclidean sense is selected, which corresponds to the following formula:

$$u^s_{j,i} = \arg_{u \in \{u^s_{j,1}, \ldots, u^s_{j,q}\}} \sum_{k=1}^{n-1} (u[k] - t[k])^2$$

As the quantization is carried out in the spherical coordinate system, the code word $u_{j,i}$ selected is characterized by a vector $u^s_{j,i}$ with spherical coordinates ($u^s_{j,i}$[1], . . . , $u^s_{j,i}$[n]).

At step 12, a vector with Cartesian coordinates $u^c_{j,i} = (u^c_{j,i}$[1], . . . , $u^c_{j,i}$[n]) characterizing the code word $u_{j,i}$ is determined from the vector with spherical coordinates $u^s_{j,i}$.

The transformation is performed for example by the following algorithm 2:

```
s = u^s_{j,i}[n];
for i = 1 to n − 2
{
    u^c_{j,i}[i] = s * cos(2 * u^s_{j,i}[n]);
    s = s * sin(u^s_{j,i}[i]);
}
u^c_{j,i}[n−1] = s * cos(2 * u^s_{j,i}[n − 1]);
u^c_{j,i}[n] = s * sin(2 * u^s_{j,i}[n − 1]);
```

The loop (i=1 to n−2) is executed for i strictly less than n−1, i.e. for i varying from i=1 to i=n−2 inclusive.

At each iteration, the component $u^c_{j,i}$[i] is calculated by finding the product of the component $u^s_{j,i}$[n], which corresponds to the modulus of the vector $u^s_{j,i}$, times the cosine of twice the component $u^s_{j,i}$[n], and times the sine of each component of the vector $u^s_{j,i}$ of rank strictly below i. The coefficient 2 used in the cosine is the complement of the normalization coefficient 0.5 in algorithm 1.

Then, the component $u^c_{j,i}$[n−1] is calculated by finding the product of the component $u^s_{j,i}$[n] times the cosine of twice the component $u^s_{j,i}$[n−1] and times the sine of each component of the vector $u^s_{j,i}$ of rank strictly below n−1.

Then, the component $u^c_{j,i}$[n] is calculated by finding the product of the component $u^s_{j,i}$[n] times the sine of twice the component $u^s_{j,i}$[n−1] and times the sine of each component of the vector $u^s_{j,i}$ of rank strictly below n−1.

In a step 13, a signal w to be transmitted is then generated from the vector with Cartesian coordinates $u^c_{j,i}$, for example by adding the vector $u^c_{j,i}$ to the vector x, or by known insertion techniques.

Figure 10:
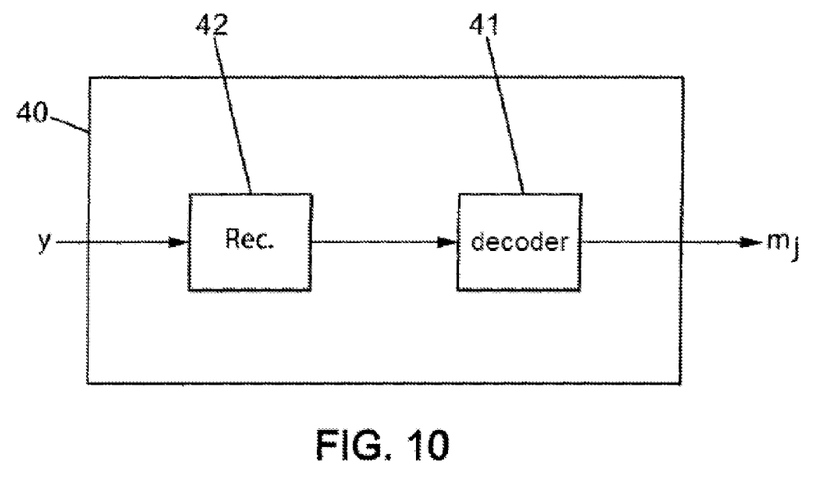
FIG. 10 is a functional diagram showing a decoder, suitable for carrying out the decoding method of FIG. 8, the decoder being incorporated in receiving equipment.

In a step 14, the signal w generated is transmitted through the communication channel 1, with receiving equipment 40 as the destination (FIG. 10).

By way of example, an illustration of the particular embodiment of the method that has just been described with n=2 is described below. Let M be a set of messages that can be transmitted. Let $m_j$ be the j-th message of the set M, j being an integer between 1 and the number of messages in the set M. Assume, for the purposes of illustration, that the set M comprises four messages. The number q of code words $u_{j,i}$ associated with each message $m_j$ is equal to four. The adjacent information is x=(3.5; 1) in Cartesian coordinates. In other words, the vector x is of size n equal to 2 and its Cartesian coordinates are x[1]=3.5 and x[2]=1.

The vector t characterizing the adjacent information x in the spherical coordinate system is determined in step 10.

Algorithm 1 applied to the numerical values x[1]=3.5 and x[2]=1 gives a vector t with spherical coordinates t[1]=8 and t[2]=3.65. These values correspond, taking into account the coefficient 0.5, to an angle θ=16 degrees (i.e. t[1]/0.5) and to a radius r=3.65.

At step 11, the quantization interval $d=2\pi/q^{1(n-1)}=360°/4=90°$ is determined, knowing that here, n and q have the values 2 and 4 respectively. Since the set M comprises four messages $m_j$, each code word $u_{j,i}$ will therefore be offset by 90/4=22.5° relative to a nearby code word.

Then the code word $u_{j,i}$ closest to the adjacent information vector t is determined by quantizing the angular part θ=16° of the spherical coordinates of this adjacent information vector t, i.e. by calculating 16/d+22.5, where "/" denotes integer division. The value 22.5 is added because we wish to code the message $m_1$ that has as first associated code word $u^s_{1,1}=(22.5; 1)$ in the spherical coordinate system.

The code word $u^s_{1,1}$ is closest to the adjacent information t and is therefore selected.

At step 12, the vector $u^s_{1,1}=(22.5; 1)$ is changed to Cartesian coordinates. Application of algorithm 2 gives $u^c_{1,1}[1]=1.875$, $u^c_{1,1}[2]=0.75$.

The code word is thus characterized, in the Cartesian coordinate system, by the vector $u^c_{1,1}=(1.875; 0.75)$. It should be noted that the calculation uses t[1]=8, which corresponds to the value obtained by algorithm 1.

The decoding method will be described, referring to FIG. 8. The method is for example executed by a decoder 41 incorporated in receiving equipment 40 (FIG. 10).

At step 20, the signal y, corresponding to the signal w, is received. The signal received y is characterized initially by a vector with Cartesian coordinates (y[1], ..., y[n]). The coordinate system of the vector y is changed to obtain a vector r characterizing the signal received in the spherical coordinate system. The change of coordinate system is performed for example by algorithm 1, by replacing t[i] with r[i] and x[i] with y[i].

At step 21, the n−1 first components r[1] to r[n−1] of the vector r are transmitted at the input of a decoder by quantization of the decoder, in order to determine the code word $u_{j,i}$ contained in the signal received. The code word $u_{j,i}$ makes it possible to determine the message $m_j$ transmitted.

Figure 8:
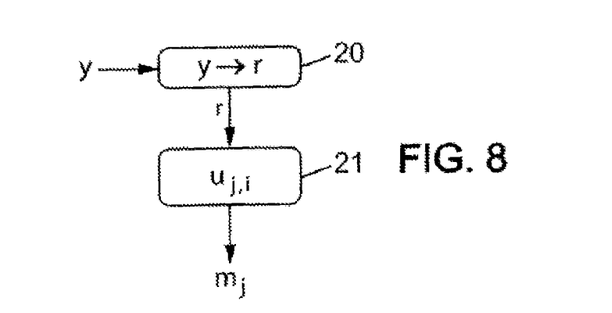
FIG. 8 is a flowchart showing the steps of a decoding method according to one embodiment of the invention.

As shown in FIGS. 7 and 8, a key k can be used at step 11 of the encoding method. In this case, the same key k is used at step 21 of the decoding method.

During encoding, the key k is used for generating a pseudo-random noise, which is added to the n−1 first components of the vector t before encoding the message $m_j$.

During decoding, the key k is used for suppressing the noise before decoding the message $m_j$.

The use of a key k makes it possible to ensure confidentiality of transmission.

FIG. 9 shows a particular embodiment in which the encoder 31 is incorporated in the transmitting equipment 30. The transmitting equipment 30 additionally comprises transmitting means 32.

The encoder 31 is intended for carrying out the encoding method, for example the embodiment of the encoding method shown in FIG. 7.

For this purpose, the encoder 31 comprises means for determining a spherical information vector, for determining a spherical information vector t from the Cartesian information vector x.

The encoder 31 also comprises means for constructing a code, for constructing a surjective correcting code using the spherical information vector t determined by the means for determining a spherical information vector.

The encoder 31 further comprises encoding means, for encoding a message $m_j$ using the surjective correcting code constructed by the means for constructing a code.

The encoder 31 is connected to the transmitting means 32, for transmitting the encoded message to the transmitting means 32.

The transmitting means 32 generate a signal w from the encoded message. Then the transmitting means 32 transmit the signal w.

FIG. 10 shows a particular embodiment in which the decoder 41 is incorporated in the receiving equipment 40. The receiving equipment 40 further comprises receiving means 42.

The receiving means 42 are suitable for receiving a signal y, corresponding to the transmitted signal w after passing through the communication channel 1.

The receiving means 42 are connected to the decoder 41, for transmitting the signal received y to the decoder 41.

The decoder 41 is intended for carrying out the decoding method, for example the embodiment of the decoding method shown in FIG. 8.

For this purpose, the decoder 41 comprises means for determining a spherical signal vector, for determining a spherical signal vector r, from the Cartesian signal vector y.

The decoder 41 also comprises decoding means, for determining, from the spherical signal vector r, a code word $u_{j,i}$ contained in the signal received.

It is quite clear that the encoder 31 and the decoder 41 are not necessarily incorporated in transmitting equipment 30 and receiving equipment 40 respectively, and that they can as a variant be incorporated in communication systems of any type with adjacent information, for example multiple-input/multiple-output (MIMO) systems, multi-user systems, broadcasting systems, digital watermarking systems, etc.

Of course, the present invention is not limited to the embodiments described above as examples; it extends to other variants.

For example, the encoding method can be applied to digital image watermarking. For this application, the host content to which the watermarking is added is regarded as adjacent information. The encoding method of the invention thus makes it possible to construct a watermarking algorithm with performance near the theoretical limits of capacity, while remaining insensitive to changes in luminosity, blurring filters, attenuation or increase in contrast.

The invention claimed is:

1. A method of encoding a message for transmission through a communication channel having adjacent information known during encoding, the encoding method comprising construction of a surjective correcting code, wherein the surjective correcting code is constructed on the basis of characterization of the adjacent information in a spherical coordinate system, wherein the method comprises the following steps:
   a) determining a spherical information vector characterizing the adjacent information in the spherical coordinate system, said spherical information vector being of size n, n being a positive integer,
   b) constructing a surjective correcting code using the spherical information vector and carrying out a quantization operation comprising:
      determining a quantization interval as a function of a number of code words to be associated with a message, the quantization interval being equal to $2\pi/q^{1/(n-1)}$, where q is the number of code words to be associated with a message, and determining, from the quantization interval, a set of code words distributed over the surface of a hypersphere with centre 0 and of radius equal to the value of a given component of the spherical information vector; and c) encoding the message, using the surjective correcting code.

2. The encoding method according to claim 1, wherein step c) comprises an operation of selecting a code word closest to the spherical information vector from the code words associated with the message.

3. The encoding method according to claim 2, wherein step c) comprises an operation of determining a Cartesian code word vector, characterizing the code word selected in a Cartesian coordinate system, from a spherical code word vector, characterizing the code word selected in the spherical coordinate system, the signal generated being a function of the Cartesian code word vector.

4. The encoding method according to claim 1, wherein, in step a), the spherical information vector is determined from a Cartesian information vector, characterizing the adjacent information in a Cartesian coordinate system, the Cartesian information vector being of size n.

5. The method according to claim 1, wherein step a) comprises an operation of generating a pseudo-random noise, from a key, the pseudo-random noise generated being added to components of the spherical information vector to ensure confidentiality of transmission.

6. A method of decoding a message encoded by the method according to claim 1, wherein the method comprises a step of determining a spherical signal vector, characterizing a signal received in a spherical coordinate system, from a Cartesian signal vector, characterizing the signal received in a Cartesian coordinate system.

7. A non-transitory computer readable storage medium comprising instructions for implementing the encoding method according to claim 1 when said program is executed by a processor.

8. A non-transitory computer readable storage medium comprising instructions for implementing the decoding method according to claim 6 when this program is executed by a processor.

9. An encoder of a message intended to be transmitted through
a communication channel having adjacent information that is known during encoding, the encoder comprising means for constructing a surjective correcting code arranged for constructing the surjective code based on characterization of the adjacent information in a spherical coordinate system, wherein the encoder comprises:

a) means for determining a spherical information vector characterizing the adjacent information in the spherical coordinate system, the spherical information vector being of size n, n being a positive integer, b) means for constructing a surjective correcting code using the spherical information vector and carrying out a quantization operation comprising:
determining a quantization interval as a function of a number of code words to be associated with a message, the quantization interval being equal to $2\pi/q^{1/(n-1)}$, where q is the number of code words to be associated with a message, and
determining, from the quantization interval, a set of code words distributed over the surface of a hypersphere with centre 0 and of radius equal to the value of a given component of the spherical information vector, and c) suitable encoding means for encoding the message, using the surjective correcting code.

10. A transmitting equipment comprising the encoder according to claim 9.

11. A device for decoding a message encoded by the encoder according to claim 9, wherein the device comprises means for determining a spherical signal vector, characterizing a signal received in a spherical coordinate system, from a Cartesian signal vector, characterizing the signal received in a Cartesian coordinate system.

12. A receiving equipment comprising the decoding device according to claim 11.

* * * * *